(12) United States Patent
Chen et al.

(10) Patent No.: US 9,237,671 B2
(45) Date of Patent: Jan. 12, 2016

(54) SLIDE RAIL ASSEMBLY FOR RACK SYSTEM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chih-Hsin Yeh, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 73 days.

(21) Appl. No.: 14/082,360

(22) Filed: Nov. 18, 2013

(65) Prior Publication Data

US 2015/0136722 A1    May 21, 2015

(51) Int. Cl.
*A47F 5/00*    (2006.01)
*H05K 7/14*    (2006.01)

(52) U.S. Cl.
CPC .................................... *H05K 7/1489* (2013.01)

(58) Field of Classification Search
CPC . H05K 7/1491; H05K 7/1421; H05K 7/1488; H05K 7/1489; Y10T 24/44; A47B 88/0422; A47B 88/044
USPC .................................... 211/134, 26, 26.2, 175
See application file for complete search history.

(56) References Cited

U.S. PATENT DOCUMENTS

| | | | |
|---|---|---|---|
| 6,442,031 B1 * | 8/2002 | Liu | 361/727 |
| 6,574,100 B1 | 6/2003 | Anderson | |
| 6,601,933 B1 * | 8/2003 | Greenwald | 312/333 |
| 6,685,033 B1 * | 2/2004 | Baddour et al. | 211/26 |
| 6,930,886 B2 | 8/2005 | Velez et al. | |
| 6,948,691 B2 | 9/2005 | Brock et al. | |
| 7,137,512 B2 | 11/2006 | Nguyen et al. | |
| 8,118,267 B2 * | 2/2012 | Yu et al. | 248/27.3 |
| 2005/0088069 A1 * | 4/2005 | Greenwald et al. | 312/333 |
| 2008/0036347 A1 * | 2/2008 | Liang | 312/334.5 |

* cited by examiner

*Primary Examiner* — Korie H Chan
(74) *Attorney, Agent, or Firm* — Rosenberg, Klein & Lee (57) ABSTRACT

A slide rail assembly for a rack system is installed to a chassis. The chassis includes a first chassis and a second chassis. The slide rail assembly includes an outer rail and an inner rail. The inner rail is movably connected to the outer rail. The first chassis of the chassis is installed to the inner rail, and the second chassis of the chassis is movably connected to the inner rail. The second chassis is movable relative to the first chassis to adjust the total length of the chassis.

6 Claims, 6 Drawing Sheets

SLIDE RAIL ASSEMBLY FOR RACK SYSTEM

BACKGROUND OF THE INVENTION

1. Fields of the invention

The present invention relates to a slide rail assembly for use in a rack system, and more particularly, to a slide rail assembly which has an adjustable length and allows a chassis to move along its adjusted length.

2. Descriptions of Related Art

To facilitate the examination and maintenance of rack-type servers in a computer system, the conventional chassis for the rack-type servers usually has slide rails installed on two sides thereof and are connected to posts of a rack by support members which are connected to the slide rails such that the servers can be easily pulled out from the rack.

U.S. Pat. Nos. 7,137,512, 6,574,100, 6,930,886 and 6,948,691 have disclosed related techniques of rack systems and are incorporated herein by reference.

The related prior art usually modularizes different electronic components of a server into different modules, such as to arrange a CPU module, a hard disk module, and a power supply module, etc. in a chassis, and connects those different modules by cables to facilitate the examination and maintenance of the servers. For example, a module, such as the CPU module, can be removed from the chassis after the cables connected between the different modules are removed. However, due to the narrow and limited space of the chassis and the complication of the cables, the removal of the cables is not easy, and this brings a lot of difficulties for the workers.

The present invention intends to provide a slide rail assembly for a rack system, wherein the length of the slide rail assembly is adjustable such that the installation or removal of the cables of the servers is facilitated.

SUMMARY OF THE INVENTION

The present invention relates to a slide rail assembly adapted to be installed to a chassis. The chassis comprises a first chassis and a second chassis. The first chassis has a retaining member, and the second chassis has a sliding member. The slide rail assembly comprises an outer rail; an inner rail longitudinally movable relative to the outer rail and having a top wall, a bottom wall and a side wall, the side wall connected between the top and bottom walls and having at least one fixing portion and at least one sliding portion, the at least one fixing portion comprising a first installation hole and a retaining hole, the first installation hole communicating with the retaining hole and having a diameter larger than a diameter of the retaining hole such that the retaining member of the first chassis is allowed to be inserted in the at least one fixing portion via the first installation hole and be further shifted to the retaining hole, the at least one sliding portion comprising a second installation hole and a slot, the second installation hole communicating with the slot and having a diameter larger than a width of the slot such that the sliding member of the second chassis is allowed to be inserted in the at least one sliding portion via the second installation hole and be further shifted to the slot; and a first positioning member connected to the side wall of the inner rail and located corresponding to the at least one fixing portion of the inner rail. The positioning member is used to prevent the retaining member from being pulled out from the at least one fixing portion via the first installation hole.

Preferably, the first positioning member has a resilient section and a contact portion, the contact portion connected to the resilient section and covering up the first installation hole of the at least one fixing portion.

The present invention also provides a slide rail assembly, which comprises an outer rail having a top plate, a bottom plate and a side plate, the side plate connected between the top plate and the bottom plate; an inner rail longitudinally movable relative to the outer rail and having a top wall, a bottom wall and a side wall, the side wall connected between the top and bottom walls, the side wall of the inner rail having at least one fixing portion and at least one sliding portion, the at least one fixing portion comprising a first installation hole and a retaining hole, the first installation hole communicating with the retaining hole and having a diameter larger than a diameter of the retaining hole, the at least one sliding portion comprising a second installation hole and a slot, the second installation hole communicating with the slot and having a diameter larger than a width of the slot, wherein a length of the slot is longer than a length of the retaining hole; and a first positioning member connected to the side wall of the inner rail, the first positioning member having a resilient section and a contact portion. The resilient section is connected to the contact portion, and the contact portion covers up the first installation hole of the at least one fixing portion.

Preferably, the rack assembly further comprises a middle rail movably connected between the outer and inner rails such that the inner rail is allowed to move away from the outer rail in cooperation with the relative movement between the middle rail and the outer rail.

The present invention yet provides a rack system, which comprises a rack having a first post, a second post, a third post and a fourth post; a first slide rail assembly connected between the first and second posts; a second slide rail assembly connected between the third and fourth posts, wherein at least one of the first and second slide rail assemblies comprises an outer rail and an inner rail, the inner rail longitudinally movable relative to the outer rail such that the inner rail is allowed to move toward or away from the outer rail to adjust a length of the at least one of the first and second slide assemblies, the inner rail having at least one fixing portion and at least one sliding portion; and a chassis connected between the first and second slide rail assemblies. The chassis comprises a first chassis and a second chassis. The first chassis is connected to the at least one fixing portion of the inner rail by a retaining member, and the second chassis is movably connected to the at least one sliding portion of the inner rail by a sliding member such that the second chassis is allowed to slide toward or away from the first chassis.

Preferably, the at least one fixing portion comprises a first installation hole and a retaining hole. The first installation hole communicates with the retaining hole and has a diameter larger than a diameter of the retaining hole.

Preferably, the at least one sliding portion has a second installation hole and a slot. The second installation hole communicates with the slot and has a diameter larger than a width of the slot.

Preferably, the rack system further comprising a first positioning member connected to the inner rail, the first positioning member having a resilient section and a contact portion. The contact portion is connected to the resilient section and covers up the first installation hole of the at least one fixing portion.

Preferably, the at least one sliding portion has a stop portion. The stop portion contacts and stops the at least one sliding member when the second chassis slides away from the first chassis to reach a maximum extended position.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
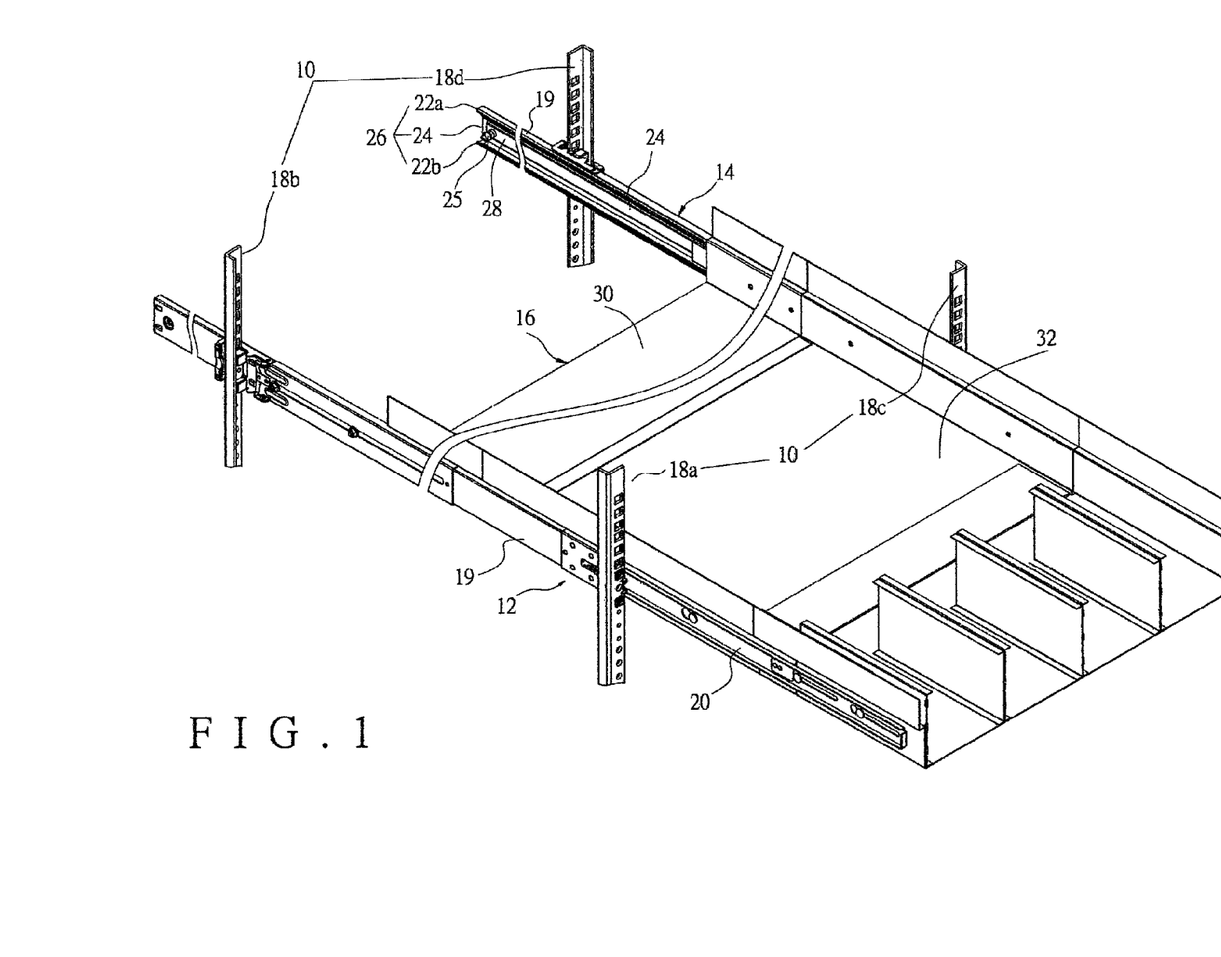
FIG. 1 is a schematic view of a rack system in accordance with a preferred embodiment of the present invention.

FIG. 1 shows a preferred embodiment of the present invention, which comprises a rack 10, a first slide rail assembly 12, a second slide rail assembly 14 and a chassis 16. The rack 10 comprises a first post 18a, a second post 18b, a third post 18c and a fourth post 18d. The first slide rail assembly 12 is connected between the first and second posts 18a, 18b. The second slide rail assembly 14 is connected between the third and fourth posts 18c, 18d. The chassis 16 is connected between the first and second slide rail assemblies 12, 14.

The first slide rail assembly 12 and the second slide rail assembly 14 are disposed symmetrically, and at least one of the first slide rail assembly 12 and the second slide rail assembly 14 has an outer rail 19 and an inner rail 20, wherein the inner rail 20 is longitudinally movable relative to the outer rail 19. Specifically, the outer rail 19 has a top plate 22a, a bottom plate 22b and a side plate 24, wherein the side plate 24 is connected between the top plate 22a and the bottom plate 22b. The top plate 22a, the bottom plate 22b and the side plate 24 of the outer rail 19 form a longitudinal passage 26, and the inner rail 20 is configured to move along the longitudinal passage 26 of the outer rail 19 such that the inner rail 20 is able to be pushed or pulled to move toward or away from the outer rail 19.

Preferably, the present invention further comprises a middle rail 28. The middle rail 28 is movably connected between the outer and inner rails 19, 20 such that the inner rail 20 is able to be pulled to move further away from the outer rail 19 in cooperation with the relative movement between the middle rail 28 and the outer rail 19. In additional, the distance that the inner rail 20 is able to move relative to the outer rail 19 can be adjusted according to needs. For example, in one embodiment, the middle rail 28 is fixed to the outer rail 19 by a bar 25, a pin, a cotter, or the like such that the middle rail 28 is unable to move relative to the outer rail 19, and thus only the inner rail 20 is pulled out when a pull force is applied to the end of the inner rail 20.

Figures 2A, 2B, 2C:
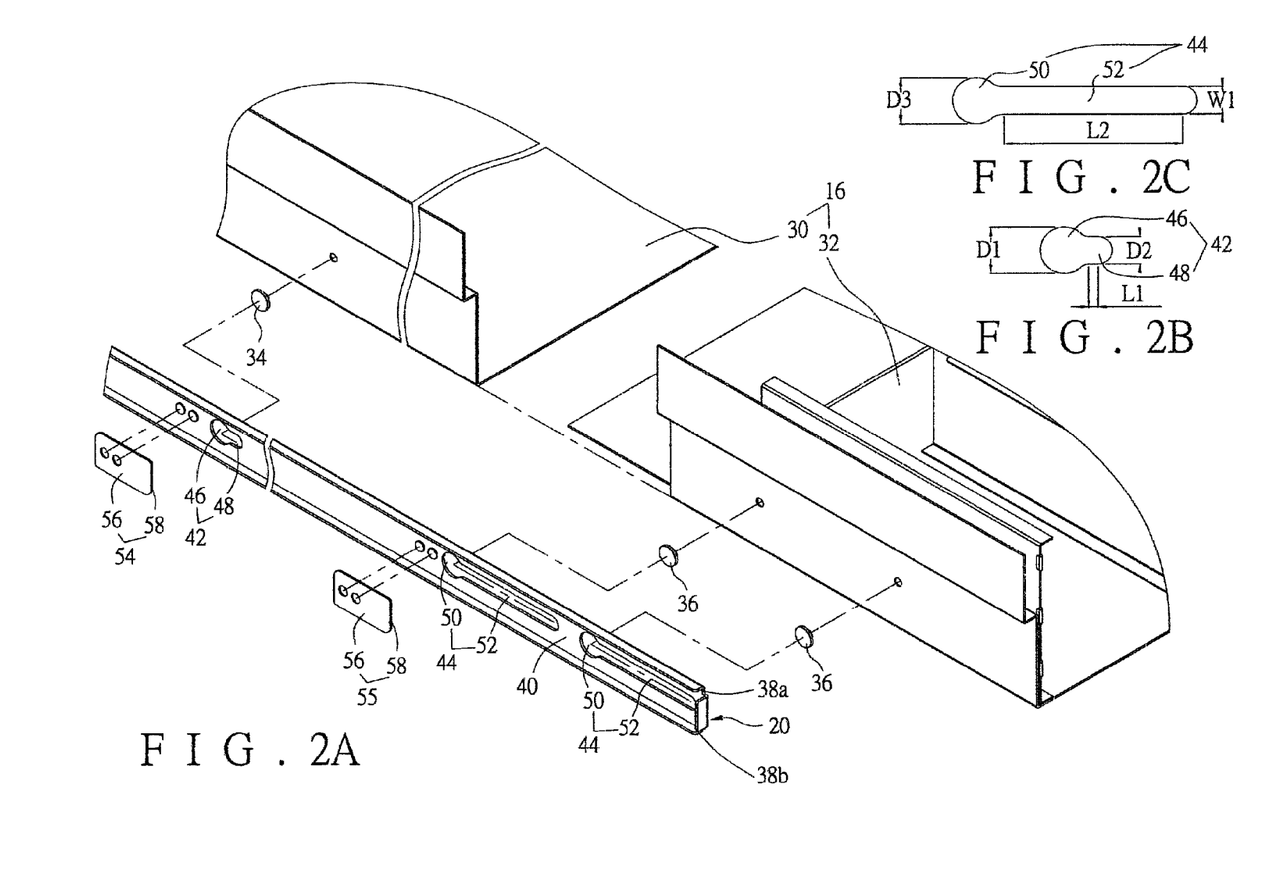
FIG. 2A is a exploded view of a inner rail and a chassis.
FIG. 2B is an enlarged view of a fixing portion of the inner rail shown in FIG. 2A.
FIG. 2C is an enlarged view of a sliding portion of the inner rail shown in FIG. 2A.
Figure 3:
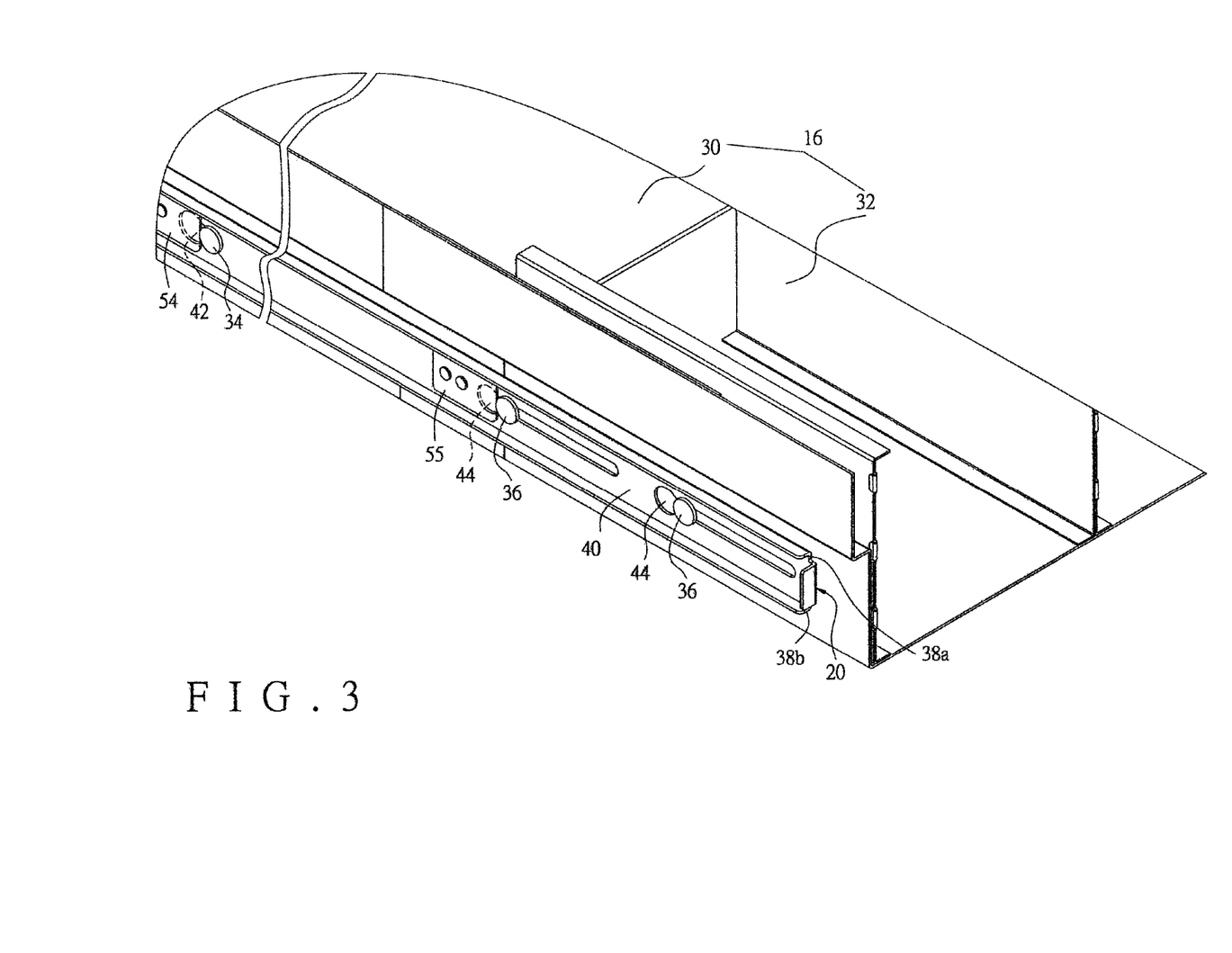
FIG. 3 is a schematic view of the rack system, wherein the inner rail is installed to the chassis.

Furthermore, as shown in FIGS. 2A and 3, the chassis 16 comprises a first chassis 30 and a second chassis 32. At least one retaining member 34 is connected to a side of the first chassis 30, and at least one sliding member 36 is connected to a side of the second chassis 32. Wherein, the first chassis 30 is connected to the inner rail 20 by the at least one retaining member 34, and the second chassis 32 is movably connected to the inner rail 20 by the at last one sliding member 36.

The inner rail 20 further comprises a top wall 38a, a bottom wall 38b and a side wall 40, wherein the side wall 40 is connected between the top and bottom walls 38a, 38b. The side wall 40 of the inner rail 20 has at least one fixing portion 42 and at least one sliding portion 44. The at least one fixing portion 42 comprises a first installation hole 46 and a retaining hole 48. The first installation hole 46 communicates with the retaining hole 48, as shown in FIGS. 2B, and has a diameter D1 larger than a diameter D2 . of the retaining hole 48 such that the at least one retaining member 34 is allowed to be inserted in or pulled out from the at least one fixing portion 42 via the first installation hole 46 although the at least one retaining member 34 is not allowed to be inserted in or pulled out from the at least one fixing portion 42 via the retaining hole 48. The at least one sliding portion 44 comprises a second installation hole 50 and a slot 52. The second installation hole 50 communicates with the slot 52, as shown in FIG. 2C, and has a diameter D3 larger than a width WI of the slot 52 such that the at least one sliding member 36 is allowed to be inserted in or pulled out from the at least one sliding portion 44 via the second installation hole 50 although the at least one sliding member 36 is not allowed to be inserted in or pulled out from the at least one sliding portion 44 via the slot 52. It is should be noted that a length L2 of the slot 52 is longer than a length L1 of the retaining hole 48.

More specifically, when the at least one retaining member 34 is inserted through the first installation hole 46 and further shifted to the retaining hole 48, the first chassis 30 is installed to the inner rail 20. When the at least one sliding member 36 is inserted through the second installation hole 50 and further shifted to the slot 52, the second chassis 32 is installed to the inner rail 20.

In one preferred embodiment, a first positioning member 54 and a second positioning member 55 are connected to the inner rail 20, wherein the first positioning member 54 is located corresponding to the at least one fixing portion 42 of the inner rail 20, and the second positioning member 55 is located corresponding to the at least one sliding portion 44 of the inner rail 20.

The first positioning member 54 comprises a resilient section 56 and a contact portion 58, wherein the contact portion 58 is connected to the resilient section 56. Preferably, the contact portion 58 extends from the resilient section 56 and is configured to cover up the first installation hole 46 to prevent the at least one retaining member 34 of the first chassis 30 from being pulled out from the first installation hole 46 when the first chassis 30 is installed to the inner rail 20. More specifically, when installation, the at least one retaining member 34 of the first chassis 30 is inserted through the first installation hole 46 to prop up the first positioning member 54 until the at least one retaining member 34 is further shifted to the retaining hole 48. Thereby, after the at least one retaining member 34 is further shifted to the retaining hole 48, the first positioning member 54 is recovered to cover up the first installation hole 46 by the elastic recovery force of the resilient section 56 such that the at least one retaining member 34 is kept in the retaining hole 48 and is not allowed to be shifted back to the first installation hole 46, and the inner rail 20 is therefore securely installed to the first chassis 30. In contrast, when removing the inner rail 20 from the first chassis 30, a user has to pull the first positioning member 54 outwardly from the inner rail 20 and shift the at least one retaining member 34 of the first chassis 30 back to the first installation hole 46 at the same time such that the at least one retaining member 34 is allowed to be pull out from the first installation hole 46, and the inner rail 20 is therefore removed from the first chassis 30.

Similarly, the second positioning member 55 is configured to prevent the at least one sliding member 36 from being pulled out from the second installation hole 50 when the second chassis 32 is installed to the inner rail 20. As the configuration of the second positioning member 55 is similar to that of the first positioning member 54, the related description is omitted herein.

Figure 4:
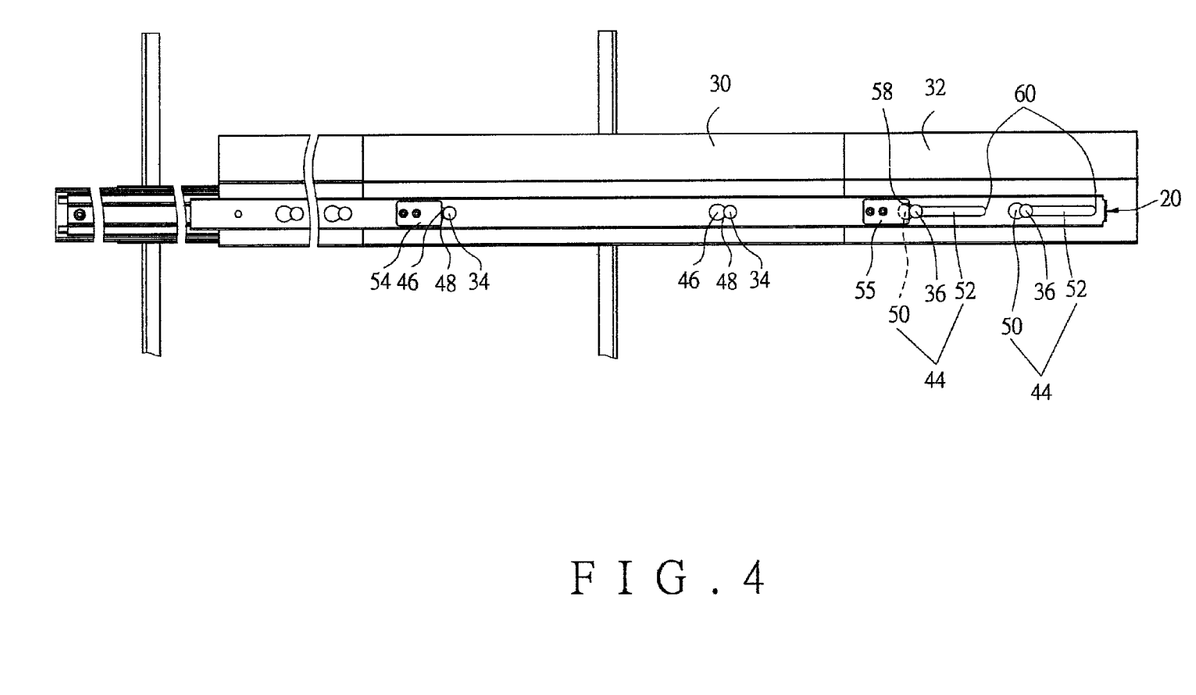
FIG. 4 is a side view of the rack system, wherein the chassis is installed to the rack.
Figure 5:
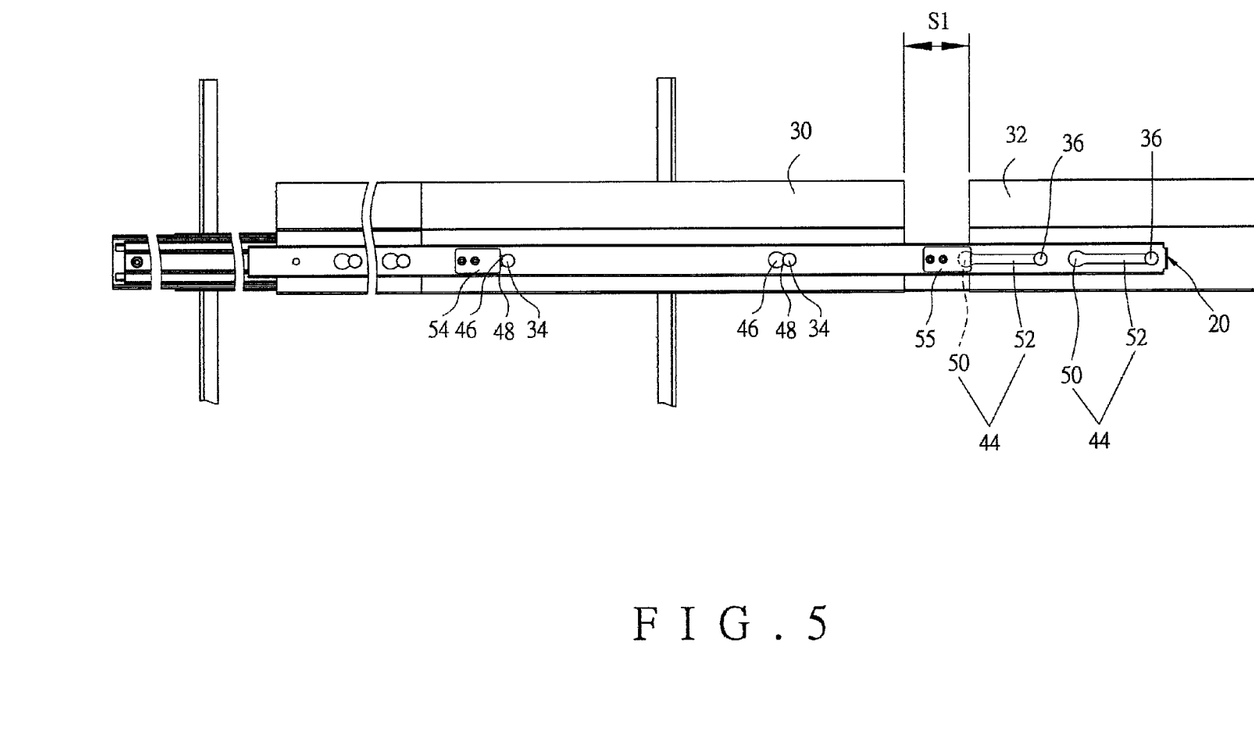
FIG. 5 is a side view of the rack system, wherein a second chassis of the chassis is pulled away from a first chassis of the chassis.

FIGS. 4 and 5 show that the first positioning member 54 covers up the first installation hole 46 upon the at least one retaining member 34 of the first chassis 30 is shifted to the retaining hole 48 such that the at least one retaining member 34 is kept in the retaining hole 48 and is not allowed to be shifted back to the first installation hole 46, and thereby the first chassis 30 is fixed to the inner rail 20.

Figure 6:
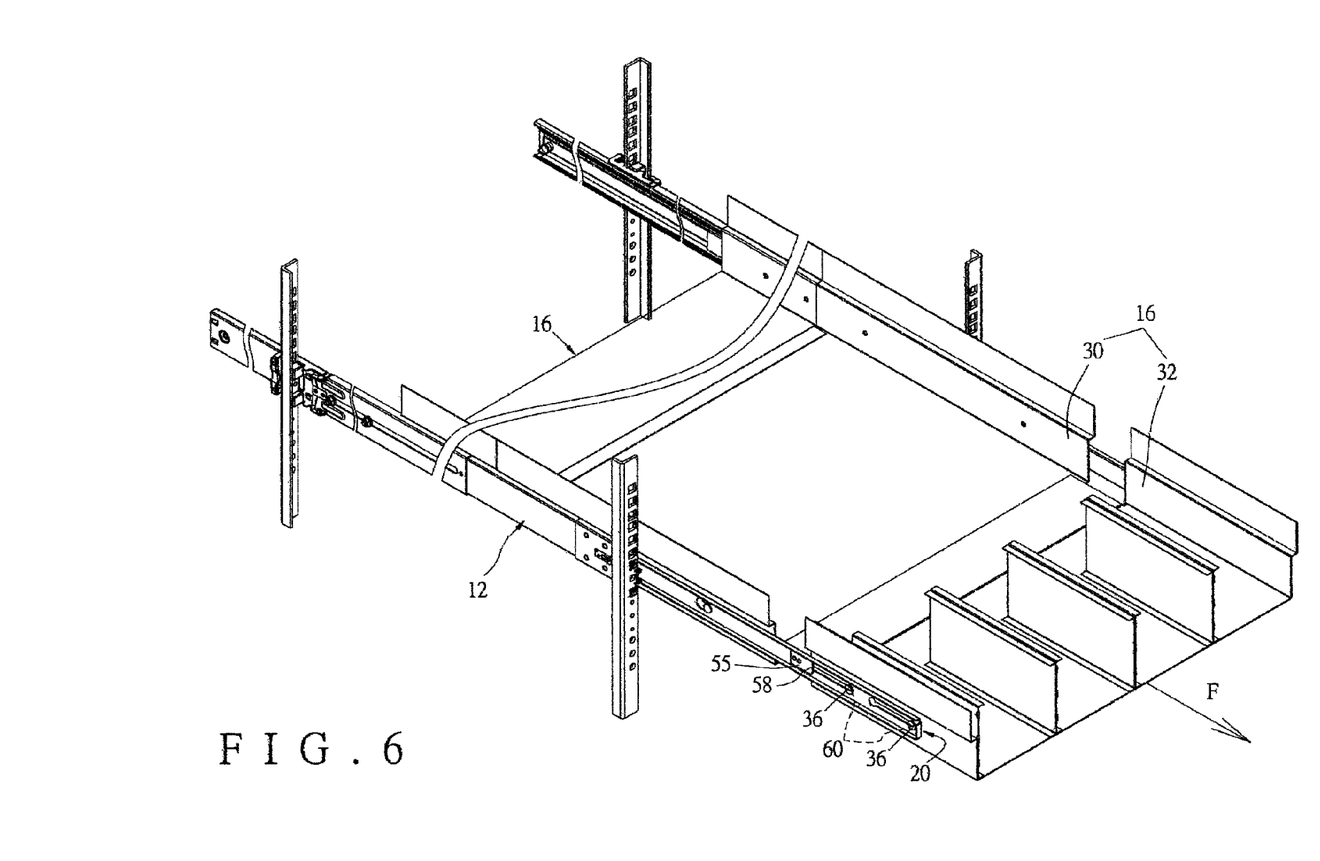
FIG. 6 is a perspective view of the rack system, wherein second chassis of the chassis is pulled away from the first chassis of the chassis.

FIGS. 4 and 5 also show that the second positioning member 55 covers up the second installation hole 50 upon the at least one sliding member 36 of the second chassis 32 is shifted to the slot 52 such that the at least one sliding member 36 is kept in the slot 52 and is not allowed to be shifted back to the second installation hole 50, and thereby the at least one sliding member 36 is limited to move in the slot 52 within a distance S1 (as shown in FIG. 5). Furthermore, referring to FIG. 6, when the second chassis 32 is moved away from the first chassis 30 by a force F applied to the second chassis 32 and reaches a maximum extended position (as shown in FIG. 6), the at least one sliding member 36 contacts and is stopped by a stop portion 60 of the sliding portion 44. On the contrary, when the second chassis 32 is moved toward the first chassis 30 and reaches a minimum extended position (as shown in FIG. 4), the at least one sliding member 36 contacts and is stopped by the contact portion 58 of the second positioning member 55.

The present invention provides an extra function of the inner rail 20 by the at least one sliding member 36, which is inserted through the at least one sliding portion 44 of the inner rail 20, and provides a sufficient space for removing the cables which are connected between different modules as well.

While we have shown and described the embodiment in accordance with the present invention, it should be clear to those skilled in the art that further embodiments may be made without departing from the scope of the present invention.

What is claimed is:

1. A slide rail assembly adapted to be installed to a chassis, the chassis comprising a first chassis and a second chassis, the first chassis having a retaining member, the second chassis having a sliding member, wherein the slide rail assembly comprises:
an outer rail;
an inner rail longitudinally movable relative to the outer rail and having a top wall, a bottom wall and a side wall, the side wall connected between the top and bottom walls and having at least one fixing portion and at least one sliding portion, the at least one fixing portion including a first installation hole and a retaining hole, the first installation hole communicating with the retaining hole and having a diameter larger than a diameter of the retaining hole such that the retaining member of the first chassis is allowed to be inserted in the at least one fixing portion via the first installation hole and be further shifted to the retaining hole, the at least one sliding portion including a second installation hole and a slot, the second installation hole communicating with the slot and having a diameter larger than a width of the slot such that the sliding member of the second chassis is allowed to be inserted in the at least one sliding portion via the second installation hole and be further shifted to the slot; and
a first positioning member connected to the side wall of the inner rail and located corresponding to the at least one fixing portion of the inner rail, the first positioning member having a resilient section extending contiguously to a contact portion, the contact portion overlapping at least a portion of the first installation hole and terminating at an edge configured to maintain the retaining member at least partially engaged with the retaining hole.

2. A slide rail assembly comprising:
an outer rail having a top plate, a bottom plate and a side plate, the side plate connected between the top plate and the bottom plate;
an inner rail longitudinally movable relative to the outer rail and having a top wall, a bottom wall and a side wall, the side wall connected between the top and bottom walls, the side wall of the inner rail having at least one fixing portion and at least one sliding portion, the at least one fixing portion including a first installation hole and a retaining hole, the first installation hole communicating with the retaining hole and having a diameter larger than a diameter of the retaining hole, the at least one sliding portion including a second installation hole and a slot, the second installation hole communicating with the slot and having a diameter larger than a width of the slot, wherein a length of the slot is longer than a length of the retaining hole; and
a first positioning member connected to the side wall of the inner rail, the first positioning member having a resilient section extending contiguously to a contact portion, the contact portion overlapping at least a portion of the first installation hole and terminating at an edge configured to maintain the retaining member at least partially engaged with the retaining hole.

3. The assembly as claimed in claim 2, further comprising a middle rail movably connected between the outer and inner rails such that the inner rail is allowed to move away from the outer rail in cooperation with the relative movement between the middle rail and the outer rail.

4. A rack system comprising:
a rack having a first post, a second post, a third post and a fourth post;
a first slide rail assembly connected between the first and second posts;
a second slide rail assembly connected between the third and fourth posts, wherein at least one of the first and second slide rail assemblies includes an outer rail and an inner rail, the inner rail movably connected to the outer rail such that the inner rail is allowed to move toward or away from the outer rail to adjust a length of the at least one of the first and second slide assemblies, the inner rail having at least one fixing portion and at least one sliding portion and a first positioning member; and
a chassis connected between the first and second slide rail assemblies, the chassis including a first chassis and a second chassis, the first chassis connected to the at least one fixing portion of the inner rail by a retaining member, the second chassis movably connected to the at least one sliding portion of the inner rail by a sliding member such that the second chassis is allowed to slide toward or away from the first chassis,
the fixing portion of the inner rail including a first installation hole and a retaining hole, the first installation hole communicating with the retaining hole and having a diameter larger than a diameter of the retaining hole, the first positioning member connected to a side wall of the inner rail and having a resilient section extending contiguously to a contact portion, the contact portion overlapping at least a portion of the first installation hole and terminating at an edge configured to maintain the retaining member at least partially engaged with the retaining hole.

5. The rack system as claimed in claim 4, wherein the at least one sliding portion has a second installation hole and a slot, the second installation hole communicating with the slot and having a diameter larger than a width of the slot.

6. The rack system as claimed in claim 4, wherein the at least one sliding portion has a stop portion, and the stop portion contacts and stops the at least one sliding member when the second chassis slides away from the first chassis to reach a maximum extended position.

* * * * *